United States Patent
Swofford et al.

(10) Patent No.: US 11,906,209 B2
(45) Date of Patent: Feb. 20, 2024

(54) THERMOELECTRIC COOLING SYSTEM

(71) Applicant: Hill Phoenix, Inc., Conyers, GA (US)

(72) Inventors: Timothy D. Swofford, Midlothian, VA (US); Neil Rathje, South Chesterfield, SC (US)

(73) Assignee: Hill Phoenix, Inc., Conyers, GA (US)

( * ) Notice: Subject to any disclaimer, the term of this patent is extended or adjusted under 35 U.S.C. 154(b) by 842 days.

(21) Appl. No.: 16/794,408

(22) Filed: Feb. 19, 2020

(65) Prior Publication Data
US 2021/0254867 A1    Aug. 19, 2021

(51) Int. Cl.
F25B 21/02 (2006.01)
F25B 7/00 (2006.01)
H10N 10/17 (2023.01)

(52) U.S. Cl.
CPC ........... *F25B 21/02* (2013.01); *F25B 7/00* (2013.01); *H10N 10/17* (2023.02); *F25B 2321/0211* (2013.01); *F25B 2321/0252* (2013.01)

(58) Field of Classification Search
CPC .......... F25B 21/02; F25B 2321/0211; F25B 2321/0252; F25B 7/00; F25B 2600/2513; F25B 25/005; H01L 35/32; B60H 1/00478; F24F 5/0042; F25D 25/028; F25D 23/067
See application file for complete search history.

(56) References Cited

U.S. PATENT DOCUMENTS

| | | | |
|---|---|---|---|
| 1,594,653 A | 8/1926 | Anstey | |
| 1,721,145 A | 7/1929 | Bromann | |
| 1,896,693 A | 2/1933 | Battista | |
| 2,136,232 A | 11/1938 | Bromann, Jr. | |
| 2,156,795 A | 5/1939 | Smith | |
| 2,181,637 A | 11/1939 | Ardito | |
| 2,209,690 A | 7/1940 | Fraser | |
| 2,225,655 A | 12/1940 | Ottenheimer | |
| 2,382,599 A | 8/1945 | Blair | |
| 2,425,473 A | 8/1947 | Hoffman | |

(Continued)

FOREIGN PATENT DOCUMENTS

| | | |
|---|---|---|
| DE | 25 05 390 A1 | 8/1976 |
| EP | 0 701 097 B1 | 5/1998 |

(Continued)

*Primary Examiner* — Joseph F Trpisovsky
(74) *Attorney, Agent, or Firm* — Fish & Richardson P.C.

(57) ABSTRACT

A thermoelectric cooling system includes a first circuit, a second circuit, a circuit heat exchanger, and a thermoelectric subsystem. The first circuit is configured to circulate a first refrigerant. The second circuit is configured to circulate a second refrigerant. The circuit heat exchanger includes a circuit heat exchanger first passage and a circuit heat exchanger second passage. The circuit heat exchanger first passage is coupled to the first circuit and configured to receive the first refrigerant from the first circuit and provide the first refrigerant to the first circuit. The circuit heat exchanger second passage is coupled to the second circuit and configured to receive the second refrigerant from the second circuit and provide the second refrigerant to the second circuit. The thermoelectric subsystem includes a thermoelectric subsystem first heat exchanger and a first thermoelectric cell. The thermoelectric subsystem first heat exchanger has a thermoelectric subsystem first heat exchanger passage.

24 Claims, 4 Drawing Sheets

(56) References Cited

U.S. PATENT DOCUMENTS

| | | |
|---|---|---|
| 2,444,593 A | 7/1948 | Davis |
| 2,495,327 A | 1/1950 | Hardin |
| 2,513,675 A | 7/1950 | Petersen |
| 2,663,159 A | 12/1953 | Ullstrand |
| 2,931,408 A | 4/1960 | Dwyer |
| 2,962,874 A | 12/1960 | Fitzgerald |
| 2,973,631 A | 3/1961 | Adkins |
| 3,210,957 A | 10/1965 | Walling et al. |
| 3,230,732 A | 1/1966 | Rutishauser et al. |
| 3,254,502 A | 6/1966 | Stafford |
| 3,850,486 A | 11/1974 | Saxe |
| 3,898,864 A | 8/1975 | Steelman |
| 4,135,369 A | 1/1979 | Allgeyer et al. |
| 4,151,723 A | 5/1979 | Gardner |
| 4,306,616 A | 12/1981 | Woods et al. |
| 4,344,296 A | 8/1982 | Staples et al. |
| 4,369,631 A | 1/1983 | Abraham |
| 4,489,995 A | 12/1984 | Barr |
| 4,493,010 A | 1/1985 | Morrison et al. |
| 4,501,126 A | 2/1985 | Norton |
| 4,712,387 A | 12/1987 | James |
| 4,984,435 A | 1/1991 | Seino et al. |
| 5,148,861 A | 9/1992 | Colvin et al. |
| 5,277,486 A | 1/1994 | Bustos |
| 5,347,827 A | 9/1994 | Rudick et al. |
| 5,357,767 A | 10/1994 | Roberts |
| 5,365,749 A | 11/1994 | Porter |
| 5,381,670 A | 1/1995 | Tippmann |
| 5,440,894 A | 8/1995 | Schaeffer et al. |
| 5,502,979 A | 4/1996 | Renard |
| 5,606,863 A | 3/1997 | Kicklighter et al. |
| 5,626,028 A | 5/1997 | Graat et al. |
| 5,675,983 A | 10/1997 | Ibrahim |
| 5,735,131 A | 4/1998 | Lambright |
| 5,743,098 A | 4/1998 | Behr |
| 5,816,051 A | 10/1998 | Hall |
| 5,921,096 A | 7/1999 | Warren |
| 5,924,297 A | 7/1999 | Wolff et al. |
| 5,931,018 A | 8/1999 | Hall |
| 5,964,512 A | 10/1999 | Borgen |
| 5,970,734 A | 10/1999 | Stillwell |
| 6,073,452 A | 6/2000 | Karp |
| 6,119,478 A * | 9/2000 | Sada ............... F25B 25/005 62/434 |
| 6,128,911 A | 10/2000 | Mathews et al. |
| RE37,054 E | 2/2001 | Sherwood |
| 6,182,459 B1 | 2/2001 | Hertel |
| 6,185,951 B1 | 2/2001 | Lane et al. |
| 6,311,512 B1 | 11/2001 | Fung et al. |
| 6,351,964 B1 | 3/2002 | Brancheau et al. |
| 6,360,548 B1 | 3/2002 | Navarro |
| 6,381,972 B1 | 5/2002 | Cotter |
| 6,401,399 B1 | 6/2002 | Roche et al. |
| 6,401,477 B1 | 6/2002 | Dubé |
| 6,412,296 B1 | 7/2002 | Rossi |
| 6,427,468 B1 | 8/2002 | Topper et al. |
| 6,438,983 B1 | 8/2002 | Zellner et al. |
| 6,460,372 B1 | 10/2002 | Fung et al. |
| 6,467,294 B1 | 10/2002 | Walker et al. |
| 6,499,535 B2 | 12/2002 | Cowans |
| 6,539,741 B2 | 4/2003 | Navarro |
| 6,547,346 B2 | 4/2003 | Topper et al. |
| 6,619,052 B1 | 9/2003 | Nash, Jr. |
| 6,672,086 B2 | 1/2004 | Zangari et al. |
| 2002/0066549 A1 | 6/2002 | Schulz et al. |
| 2002/0184904 A1 | 12/2002 | Wellman |
| 2003/0230095 A1 | 12/2003 | Kahler |
| 2005/0126196 A1 | 6/2005 | Grassmuck et al. |
| 2009/0084112 A1* | 4/2009 | Ham ............... F28D 15/00 165/104.11 |
| 2010/0158660 A1* | 6/2010 | Radhakrishnan ....... H01L 35/00 414/800 |
| 2014/0298824 A1* | 10/2014 | Truemper ........... B64D 13/08 62/324.1 |
| 2017/0018825 A1* | 1/2017 | Grünwald ............ F28F 3/08 |
| 2019/0271489 A1* | 9/2019 | Höjer ............... F25D 17/02 |

FOREIGN PATENT DOCUMENTS

| | | |
|---|---|---|
| EP | 0 916 291 B1 | 5/2001 |
| GB | 2 185 561 B | 9/1990 |
| JP | 2000-274935 A | 10/2000 |
| WO | WO-2008/082390 A1 | 7/2008 |
| WO | WO-2008/082391 A1 | 7/2008 |
| WO | WO-2008082390 A1 * | 7/2008 ........... A47F 3/0482 |

* cited by examiner

THERMOELECTRIC COOLING SYSTEM

TECHNICAL FIELD

The present application relates generally to a thermoelectric cooling system.

BACKGROUND

Cooling systems circulate a refrigerant and cause that refrigerate to undergo a thermodynamic cycle. The thermodynamic cycle causes a temperature of the refrigerant to change between a maximum temperature and a minimum temperature. Cooling systems transfer heat from a desired space to the refrigerant.

SUMMARY

In one embodiment, a thermoelectric cooling system includes a first circuit, a second circuit, a circuit heat exchanger, and a thermoelectric subsystem. The first circuit is configured to circulate a first refrigerant. The second circuit is configured to circulate a second refrigerant. The circuit heat exchanger includes a circuit heat exchanger first passage and a circuit heat exchanger second passage. The circuit heat exchanger first passage is coupled to the first circuit and configured to receive the first refrigerant from the first circuit and provide the first refrigerant to the first circuit. The circuit heat exchanger second passage is coupled to the second circuit and configured to receive the second refrigerant from the second circuit and provide the second refrigerant to the second circuit. The thermoelectric subsystem includes a thermoelectric subsystem first heat exchanger and a first thermoelectric cell. The thermoelectric subsystem first heat exchanger has a thermoelectric subsystem first heat exchanger passage that is coupled to the second circuit and configured to receive the second refrigerant from the second circuit and provide the second refrigerant to the second circuit. The first thermoelectric cell is coupled to the thermoelectric subsystem first heat exchanger.

In another embodiment, a temperature controlled case includes a rear wall, a first sidewall, a second sidewall, a front wall, and a thermoelectric cooling system. The first sidewall is coupled to the rear wall. The second sidewall is coupled to the rear wall. The front wall is coupled to the first sidewall and the second sidewall. The thermoelectric cooling system includes a first circuit, a second circuit, a circuit heat exchanger, and a thermoelectric subsystem. The first circuit is configured to circulate a first refrigerant. The second circuit is configured to circulate a second refrigerant. The circuit heat exchanger is coupled to the first circuit and the second circuit. The thermoelectric subsystem includes a thermoelectric subsystem first heat exchanger and a first thermoelectric cell. The thermoelectric subsystem first heat exchanger is coupled to the second circuit. The first thermoelectric cell is coupled to the thermoelectric subsystem first heat exchanger and at least one of the rear wall, the first sidewall, the second sidewall, or the front wall.

In yet another embodiment, a thermoelectric subsystem for a thermoelectric cooling system includes a thermoelectric subsystem first heat exchanger, a first thermoelectric cell, and a thermoelectric subsystem second heat exchanger. The thermoelectric subsystem first heat exchanger has a thermoelectric subsystem first heat exchanger passage that is configured to receive a refrigerant and to provide a refrigerant. The first thermoelectric cell is configured to be coupled to the thermoelectric subsystem first heat exchanger. The thermoelectric subsystem second heat exchanger is configured to be coupled to the first thermoelectric cell opposite the thermoelectric subsystem first heat exchanger. The first thermoelectric cell separates the thermoelectric subsystem first heat exchanger from the thermoelectric subsystem second heat exchanger.

BRIEF DESCRIPTION OF THE DRAWINGS

The details of one or more implementations are set forth in the accompanying drawings and the description below. Other features, aspects, and advantages of the disclosure will become apparent from the description, the drawings, and the claims, in which:

Figure 1:
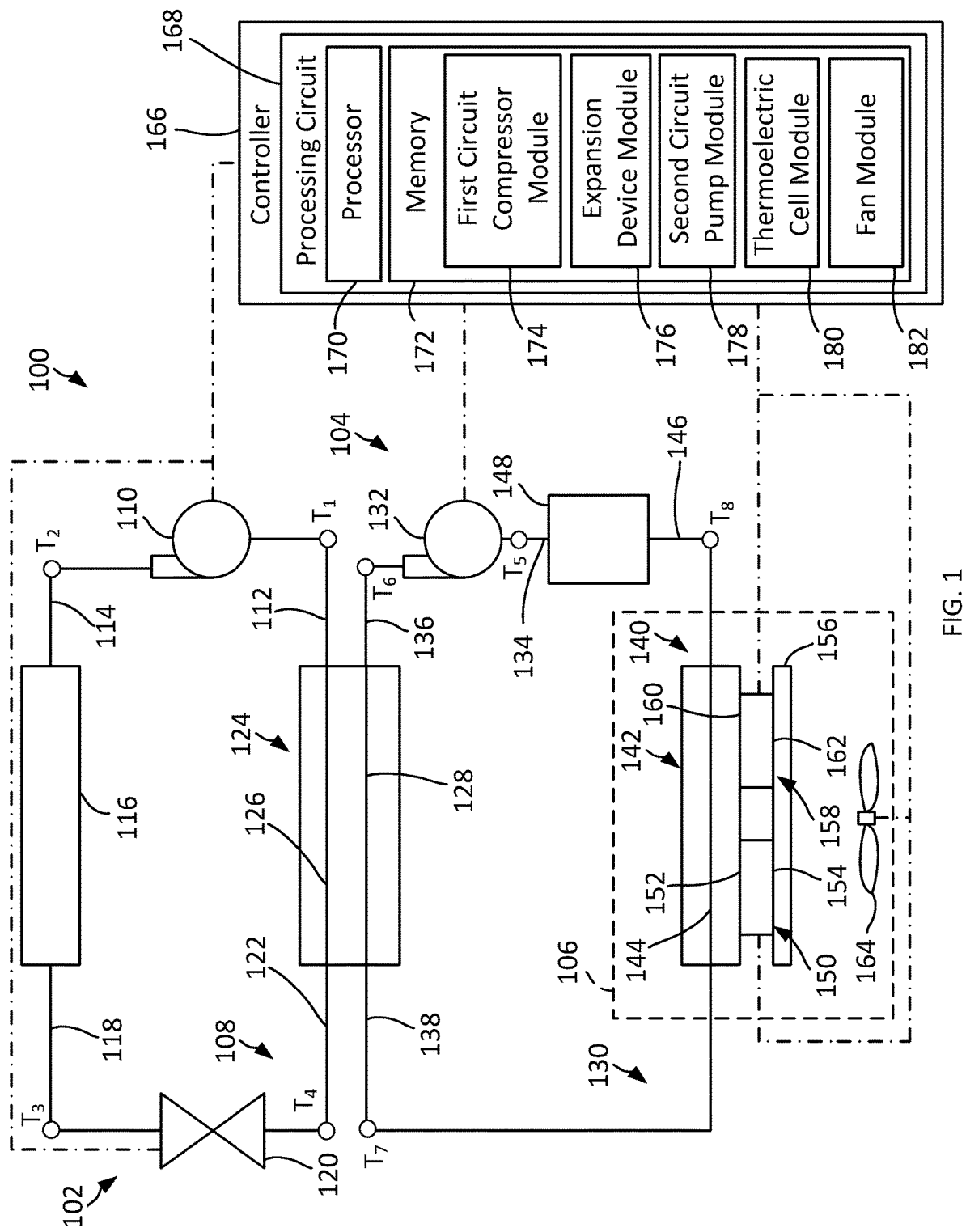
FIG. 1 is a block schematic diagram of an example thermoelectric cooling system.

It will be recognized that some or all of the Figures are schematic representations for purposes of illustration. The Figures are provided for the purpose of illustrating one or more implementations with the explicit understanding that they will not be used to limit the scope or the meaning of the claims.

DETAILED DESCRIPTION

Following below are more detailed descriptions of various concepts related to, and implementations of, methods, apparatuses, and for providing cooling using a thermoelectric cooling system. The various concepts introduced above and discussed in greater detail below may be implemented in any of a number of ways, as the described concepts are not limited to any particular manner of implementation. Examples of specific implementations and applications are provided primarily for illustrative purposes.

I. Overview

Providing a target, such as a temperature controlled enclosure, with cooling is often performed in order to store products, such as refrigerated goods or frozen goods, in the target. The target and/or the products may be associated with a target temperature. The target typically includes various refrigeration systems that attempt to establish the target temperature within the target. However, establishing the target temperature can be difficult using typical refrigeration systems. Furthermore, it can be difficult to dramatically change the target temperature using typical refrigeration systems. For example, typical refrigeration systems may be unable to change the target temperature from a first target temperature associated with refrigerated goods to a second target temperature associated with frozen goods.

Implementations described herein relate to a thermoelectric cooling system that has two circuits each circulating a separate refrigerant, a circuit heat exchanger that exchanges heat between the refrigerants within the two circuits, and a thermoelectric subsystem that provides the cooling provided by one circuit to a thermoelectric cell which provides cooling to a target. In addition to providing cooling, thermoelectric cells also provide heating. Rather than merely cooling the target using a thermoelectric cell that is completely separate from any other source of cooling, implementations described herein use refrigerant to cool the thermoelectric cell via a heat exchanger to which the thermoelectric cell is coupled and within which refrigerant from one of the circuits is routed. By cooling the thermoelectric cell using the refrigerant, a temperature gradient across the thermoelectric cell is decreased and a rate of cooling provided by the thermoelectric cell is increased. As a result, implementations described herein are capable of operating more efficiently than other refrigeration systems, such as refrigeration systems that use a thermoelectric cell that is completely separate from any other source of cooling.

Additionally, implementations described herein are capable of rapidly and easily changing a target temperature of the target due to the use of the thermoelectric cell. Specifically, a voltage supplied to the thermoelectric cell can be varied by a controller. In this way, the controller can rapidly reconfigure the target for medium temperature uses, such as storage of refrigerated products, or low temperature uses, such as storage of frozen products.

Furthermore, implementations described herein are also capable of integrating the thermoelectric subassembly into a shelf of the target. In this way, the shelf can be provided with localized cooling. This localized cooling can enable the shelf to be used for one use, such as storage of frozen products, while another portion of the target is used for a different use, such as storage of refrigerated products.

II. Example Thermoelectric Cooling System

FIG. 1 depicts an example thermoelectric cooling system 100. The thermoelectric cooling system 100 includes a first circuit 102 (e.g., loop, etc.) and a second circuit 104 (e.g., loop, etc.). Collectively, the first circuit 102 and the second circuit 104 form a cascade refrigeration system where, as is explained in more detail herein, the first circuit 102 and the second circuit 104 cooperate to provide cooling to a target 106 (e.g., temperature controlled enclosure, etc.). In other words, the first circuit 102 and the second circuit 104 are operable to decrease a temperature of the target 106 to a target temperature and/or to maintain a temperature of the target 106 at a target temperature. The target 106 may be, for example, a display case, a freezer case, a temperature controlled case, a refrigerator, a freezer, a locker, a temperature controlled device, a walk-in cooler, or other similar structures.

The first circuit 102 circulates a first circuit refrigerant (e.g., coolant, working fluid, etc.) within a first circuit conduit system 108 (e.g., plumbing system, piping system, etc.). The first circuit 102 includes a first circuit compressor 110. The first circuit compressor 110 is coupled to (e.g., attached to, in fluid communication with, secured to, connected to, etc.) a first circuit conduit system first conduit 112 of the first circuit conduit system 108 and a first circuit conduit system second conduit 114 of the first circuit conduit system 108. The first circuit compressor 110 receives the first circuit refrigerant from the first circuit conduit system first conduit 112 and is configured to provide the first circuit refrigerant to the first circuit conduit system second conduit 114.

The first circuit 102 also includes a first circuit condenser 116 (e.g., heat exchanger, cooling coil, cooling tower, etc.). The first circuit condenser 116 is coupled to the first circuit conduit system second conduit 114 and a first circuit conduit system third conduit 118 of the first circuit conduit system 108. The first circuit condenser 116 is configured to receive the first circuit refrigerant from the first circuit conduit system second conduit 114 and provide the first circuit refrigerant to the first circuit conduit system third conduit 118. As is explained in more detail herein, the first circuit condenser 116 is configured to transfer heat from the first circuit refrigerant to an ambient environment so as to cool the first circuit refrigerant within the first circuit condenser 116. The first circuit condenser 116 may be coupled to an external surface of the target 106.

The first circuit 102 also includes a first circuit expansion device 120 (e.g., flow restrictor, valve, orifice plate, etc.). The first circuit expansion device 120 is coupled to the first circuit conduit system third conduit 118 and a first circuit conduit system fourth conduit 122 of the first circuit conduit system 108. The first circuit expansion device 120 is configured to receive the first circuit refrigerant from the first circuit conduit system third conduit 118 and provide the first circuit refrigerant to the first circuit conduit system fourth conduit 122. As is explained in more detail herein, the first circuit expansion device 120 is configured to cause expansion of the first circuit refrigerant and, consequently, cooling of the first circuit refrigerant.

The thermoelectric cooling system 100 also includes a circuit heat exchanger 124 (e.g., shell and tube heat exchanger, etc.). The circuit heat exchanger 124 includes a circuit heat exchanger first passage 126 (e.g., channel, etc.) and a circuit heat exchanger second passage 128 (e.g., channel, etc.). As is explained in more detail herein, the circuit heat exchanger 124 is configured to facilitate transfer of heat between the circuit heat exchanger first passage 126 and the circuit heat exchanger second passage 128 so as to cause heating of the first circuit refrigerant within the circuit heat exchanger 124. The circuit heat exchanger first passage 126 is coupled to the first circuit conduit system fourth conduit 122 and the first circuit conduit system first conduit 112. The circuit heat exchanger first passage 126 is configured to receive the first circuit refrigerant from the first circuit conduit system fourth conduit 122 and provide the refrigerant to the first circuit conduit system first conduit 112. In some embodiments, the circuit heat exchanger 124 is insulated so as to maximize heat transfer between the circuit heat exchanger first passage 126 and the circuit heat exchanger second passage 128 while simultaneously minimizing heat transfer between the circuit heat exchanger first passage 126 and an ambient environment surrounding the circuit heat exchanger 124 and/or heat transfer between the circuit heat exchanger second passage 128 and an ambient environment surrounding the circuit heat exchanger 124.

The second circuit 104 circulates a second circuit refrigerant (e.g., coolant, working fluid, etc.) within a second circuit conduit system 130 (e.g., plumbing system, piping system, etc.). The second circuit 104 includes a second circuit pump 132 (e.g., compressor, positive-displacement pump, positive-displacement compressor, rotary pump, rotary compressor, etc.). The second circuit pump 132 is coupled to a second circuit conduit system first conduit 134 of the second circuit conduit system 130 and a second circuit conduit system second conduit 136 of the second circuit conduit system 130. The second circuit pump 132 receives the second circuit refrigerant from the second circuit conduit system first conduit 134 and is configured to provide the second circuit refrigerant to the second circuit conduit system second conduit 136.

The circuit heat exchanger second passage 128 is coupled to the second circuit conduit system second conduit 136 and a second circuit conduit system third conduit 138 of the second circuit conduit system 130. The circuit heat exchanger second passage 128 is configured to receive the second circuit refrigerant from the second circuit conduit system second conduit 136 and provide the second circuit refrigerant to the second circuit conduit system third conduit 138. As is explained in more detail herein, the circuit heat exchanger 124 is configured to facilitate transfer of heat between the circuit heat exchanger first passage 126 and the circuit heat exchanger second passage 128 so as to cause cooling of the second circuit refrigerant within the circuit heat exchanger 124.

The thermoelectric cooling system 100 also includes a thermoelectric subsystem 140. As is explained in more detail herein, the thermoelectric subsystem 140 is configured to provide cooling to the target 106 while simultaneously harnessing cooling provided by the second circuit refrigerant. In this way, the thermoelectric subsystem 140 is capable of providing additional cooling to the target 106 which could not be provided if the thermoelectric subsystem 140 did not harness cooling provided by the second circuit refrigerant.

The thermoelectric subsystem 140 includes a thermoelectric subsystem first heat exchanger 142. The thermoelectric subsystem first heat exchanger 142 includes a thermoelectric subsystem first heat exchanger passage 144. The thermoelectric subsystem first heat exchanger passage 144 is coupled to the second circuit conduit system third conduit 138 and a second circuit conduit system fourth conduit 146 of the second circuit conduit system 130.

The second circuit 104 also includes a reservoir 148 (e.g., tank, etc.). The reservoir 148 is configured to store (e.g., contain, collect, hold, etc.) a target amount of the second circuit refrigerant. The reservoir 148 is coupled to the second circuit conduit system fourth conduit 146 and the second circuit conduit system first conduit 134. The reservoir 148 is configured to receive the second circuit refrigerant from the second circuit conduit system fourth conduit 146 and to provide the second circuit refrigerant to the second circuit conduit system first conduit 134.

The thermoelectric subsystem 140 also includes a first thermoelectric cell 150 (e.g., Peltier cell, Peltier device, etc.). As is explained in more detail herein, the first thermoelectric cell 150 is configured to be cooled by the second circuit refrigerant and to provide cooling to the target 106. By being cooled by the second circuit refrigerant, the first thermoelectric cell 150 is capable of providing significantly more cooling to the target 106 than if the first thermoelectric cell 150 was not cooled by the second circuit refrigerant.

The first thermoelectric cell 150 has a first thermoelectric cell first side 152 (e.g., surface, face, etc.) and a first thermoelectric cell second side 154 (e.g., surface, face, etc.). In various embodiments, the first thermoelectric cell second side 154 is opposite the first thermoelectric cell first side 152. The first thermoelectric cell first side 152 is coupled to the thermoelectric subsystem first heat exchanger 142 (e.g., the first thermoelectric cell first side 152 is in contact with an external surface of the thermoelectric subsystem first heat exchanger 142). The first thermoelectric cell second side 154 is coupled to a thermoelectric subsystem second heat exchanger 156 (e.g., the first thermoelectric cell second side 154 is in contact with an external surface of the thermoelectric subsystem second heat exchanger 156). In this way, the first thermoelectric cell 150 separates the thermoelectric subsystem first heat exchanger 142 from the thermoelectric subsystem second heat exchanger 156.

The thermoelectric subsystem 140 also includes a second thermoelectric cell 158 (e.g., Peltier cell, Peltier device, etc.). As is explained in more detail herein, the second thermoelectric cell 158 is configured to be cooled by the second circuit refrigerant and to provide cooling to the target 106. By being cooled by the second circuit refrigerant, the second thermoelectric cell 158 is capable of providing significantly more cooling to the target 106 than if the second thermoelectric cell 158 was not cooled by the second circuit refrigerant.

The second thermoelectric cell 158 has a second thermoelectric cell first side 160 (e.g., surface, face, etc.) and a second thermoelectric cell second side 162 (e.g., surface, face, etc.). In various embodiments, the second thermoelectric cell second side 162 is opposite the second thermoelectric cell first side 160. The second thermoelectric cell first side 160 is coupled to the thermoelectric subsystem first heat exchanger 142 (e.g., the second thermoelectric cell first side 160 is in contact with an external surface of the thermoelectric subsystem first heat exchanger 142). The second thermoelectric cell second side 162 is coupled to the thermoelectric subsystem second heat exchanger 156 (e.g., the second thermoelectric cell second side 162 is in contact with an external surface of the thermoelectric subsystem second heat exchanger 156). In this way, the second thermoelectric cell 158 separates the thermoelectric subsystem first heat exchanger 142 from the thermoelectric subsystem second heat exchanger 156. In some embodiments, the thermoelectric subsystem 140 includes only the first thermoelectric cell 150 and does not include the second thermoelectric cell 158. In other embodiments, the thermoelectric subsystem 140 includes the first thermoelectric cell 150, the second thermoelectric cell 158, and at least one additional thermoelectric cell similar to the first thermoelectric cell 150 and/or the second thermoelectric cell 158. In these ways, the thermoelectric cooling system 100 may be tailored for a target application (e.g., for a specific configuration of the target 106, etc.).

The cooling provided by the thermoelectric subsystem first heat exchanger 142 to the first thermoelectric cell 150 and the second thermoelectric cell 158 significantly increases the ability of the first thermoelectric cell 150 and the second thermoelectric cell 158 to cool the thermoelectric subsystem second heat exchanger 156 (e.g., compared to if the first thermoelectric cell 150 and the second thermoelectric cell 158 were not cooled by the thermoelectric subsystem first heat exchanger 142 and instead were placed within the target 106 separate from the second circuit 104, etc.). Specifically, the cooling provided by the thermoelectric subsystem first heat exchanger 142 reduces a temperature differential across the first thermoelectric cell 150 and the second thermoelectric cell 158, thereby aiding in transfer of heat from the first thermoelectric cell second side 154 to the first thermoelectric cell first side 152 and from the second thermoelectric cell second side 162 to the second thermoelectric cell first side 160 (e.g., due to decreased thermal resistance, etc.). As a result, a rate of heat transfer from the first thermoelectric cell 150 (e.g., to the target 106) is greater when the first thermoelectric cell 150 is coupled to the thermoelectric subsystem first heat exchanger 142 than when the first thermoelectric cell 150 is not coupled to the thermoelectric subsystem first heat exchanger 142. Similarly, a rate of heat transfer from the second thermoelectric cell 158 (e.g., to the target 106) is greater when the second thermoelectric cell 158 is coupled to the thermoelectric subsystem first heat exchanger 142 than when the second thermoelectric cell 158 is not coupled to the thermoelectric subsystem first heat exchanger 142. An example comparison is set forth in Table 1, below.

TABLE 1

Comparison between a first configuration where the first thermoelectric cell 150 is coupled to the thermoelectric subsystem first heat exchanger 142 and a second configuration where the first thermoelectric cell 150 is not coupled to the thermoelectric subsystem first heat exchanger 142.

| | The First Thermoelectric Cell 150 is Coupled to the Thermoelectric Subsystem First Heat Exchanger 142 | The First Thermoelectric Cell 150 is Not Coupled to the Thermoelectric Subsystem First Heat Exchanger 142 |
|---|---|---|
| Temperature of the First Thermoelectric Cell First Side 152 [degrees Celsius] | 5 | 15 |
| Temperature of the First Thermoelectric Cell Second Side 154 [degrees Celsius] | −5 | 10 |
| Rate of Heat Transfer from the First Thermoelectric Cell 150 [ ] | $\dot{q}_1$ | $\dot{q}_2 > \dot{q}_1$ |

In various embodiments, the thermoelectric subsystem 140 also includes a fan 164 (e.g., blower, etc.). The fan 164 is configured to blow air across the thermoelectric subsystem second heat exchanger 156, thereby increasing a rate of transfer of cooling from the thermoelectric subsystem second heat exchanger 156 to the target 106 and/or functioning to direct cooling to a target location (e.g., a shelf, etc.) within the target 106. The thermoelectric subsystem second heat exchanger 156 may include a plurality of fins (e.g., vanes, etc.) that are configured to increase a rate of transfer of cooling from the thermoelectric subsystem second heat exchanger 156 to the target 106.

In various embodiments, the first thermoelectric cell 150 and the second thermoelectric cell 158 are arranged in series, such as is shown in FIG. 1. When in series, the thermoelectric subsystem first heat exchanger passage 144 extends across one of the first thermoelectric cell 150 or the second thermoelectric cell 158, and then across the other of the first thermoelectric cell 150 or the second thermoelectric cell 158. In other embodiments, the first thermoelectric cell 150 and the second thermoelectric cell 158 are arranged in parallel. When in parallel, the thermoelectric subsystem first heat exchanger passage 144 extends across at least a portion of the first thermoelectric cell 150 and at least a portion of the second thermoelectric cell 158 simultaneously.

The thermoelectric cooling system 100 also includes a controller 166. The first circuit compressor 110, the first circuit expansion device 120, the second circuit pump 132, the first thermoelectric cell 150, the second thermoelectric cell 158, and the fan 164 are electrically coupled and/or communicatively coupled to the controller 166. Various sensors (e.g., temperature sensors, flow rate sensors, quality sensors, pressure sensors, etc.) may additionally be electrically coupled and/or communicatively coupled to the controller 166. These various sensors may be capable of determining refrigerant parameters (e.g., temperature, flow rate, quality, pressure, volumetric flow rate, mass flow rate, etc.) of the first circuit refrigerant and/or the second circuit refrigerant.

The controller 166 includes a processing circuit 168. The processing circuit 168 includes a processor 170 and a memory 172. The processor 170 may include a microprocessor, an application-specific integrated circuit (ASIC), a field-programmable gate array (FPGA), other similar components, or combinations thereof. The memory 172 may include, but is not limited to, electronic, optical, magnetic, or any other storage or transmission device capable of providing a processor, ASIC, FPGA, or other similar components, with program instructions. The memory 172 may include a memory chip, Electrically Erasable Programmable Read-Only Memory (EEPROM), Erasable Programmable Read Only Memory (EPROM), flash memory, or any other suitable memory from which the controller 166 can read instructions. The instructions may include code from any suitable programming language.

The memory 172 may include various modules that include instructions which are configured to be implemented by the processor 170. The memory 172 includes a first circuit compressor module 174. The first circuit compressor module 174 includes instructions which are configured to be implemented by the processor 170 to control operation of the first circuit compressor 110. The memory 172 also includes an expansion device module 176. The expansion device module 176 includes instructions which are configured to be implemented by the processor 170 to control operation of the first circuit expansion device 120. The memory 172 also includes a second circuit pump module 178. The second circuit pump module 178 includes instructions which are configured to be implemented by the processor 170 to control operation of the second circuit pump 132. The memory 172 also includes a thermoelectric cell module 180. The thermoelectric cell module 180 includes instructions which are configured to be implemented by the processor 170 to control operation of the first thermoelectric cell 150 and/or the second thermoelectric cell 158. The memory 172 also includes a fan module 182. The fan module 182 includes instructions which are configured to be implemented by the processor 170 to control operation of the fan 164.

The controller 166 is configured to control operation of the first circuit compressor 110 (e.g., based on the instructions stored in the first circuit compressor module 174, etc.). For example, the controller 166 may control an operating parameter (e.g., voltage supplied to the first circuit compressor 110, current supplied to the first circuit compressor 110, etc.) of the first circuit compressor 110 in order to achieve a target refrigerant parameter of the refrigerant within the first circuit conduit system 108.

The controller 166 is configured to control operation of the first circuit expansion device 120 (e.g., based on the instructions stored in the expansion device module 176, etc.). For example, the controller 166 may control a position (e.g., rotational position, translational position, etc.) of the first circuit expansion device 120 in order to achieve a target refrigerant parameter of the refrigerant within the first circuit conduit system 108.

The controller 166 is configured to control operation of the second circuit pump 132 (e.g., based on the instructions stored in the second circuit pump module 178, etc.). For example, the controller 166 may control an operating parameter (e.g., voltage supplied to the second circuit pump 132, current supplied to the second circuit pump 132, etc.) of the second circuit pump 132 in order to achieve a target refrigerant parameter of the refrigerant within the first circuit conduit system 108.

The controller 166 is configured to control operation of the first thermoelectric cell 150 and/or the second thermoelectric cell 158 (e.g., based on the instructions stored in the thermoelectric cell module 180, etc.). For example, the controller 166 may control an operating parameter (e.g., voltage supplied to the first thermoelectric cell 150, current supplied to the first thermoelectric cell 150, etc.) of the first thermoelectric cell 150 and/or an operating parameter (e.g., voltage supplied to the second thermoelectric cell 158, current supplied to the second thermoelectric cell 158, etc.) of the second thermoelectric cell 158 in order to achieve a target parameter (e.g., temperature, humidity, etc.) associated with the target 106.

The controller 166 is configured to control operation of the fan 164 (e.g., based on the instructions stored in the fan module 182, etc.). For example, the controller 166 may control an operating parameter (e.g., voltage supplied to the fan 164, current supplied to the fan 164, etc.) of the fan 164 in order to achieve a target parameter associated with the target 106.

An example operation of the thermoelectric cooling system 100 includes the controller 166 operating the first circuit compressor 110 to receive the first circuit refrigerant from the first circuit conduit system first conduit 112 at a first temperature $T_1$ and to provide the first circuit refrigerant to the first circuit conduit system second conduit 114 at a second temperature $T_2$. The $T_2$ is greater than the $T_1$. The first circuit refrigerant is then passed through the first circuit condenser 116 and is cooled to a third temperature $T_3$. The $T_3$ is less than the $T_2$. The first circuit refrigerant is then passed through the first circuit expansion device 120 and is further cooled to a fourth temperature $T_4$ (e.g., due to the Joule-Thomson effect, etc.). The $T_4$ is less than the $T_3$. The first circuit refrigerant is then passed through the circuit heat exchanger 124.

The controller 166 operates the second circuit pump 132 to receive the second circuit refrigerant from the second circuit conduit system first conduit 134 at a fifth temperature $T_5$ and to provide the second circuit refrigerant to the second circuit conduit system second conduit 136 at a sixth temperature $T_6$. The $T_6$ is greater than the $T_5$. Additionally, the $T_6$ is greater than the $T_4$. The second circuit refrigerant is then passed through the circuit heat exchanger 124.

The thermoelectric subsystem first heat exchanger 142 causes heat to be transferred from the second circuit refrigerant within the circuit heat exchanger second passage 128 to be transferred to the first circuit refrigerant within the circuit heat exchanger first passage 126. In other words, the second circuit refrigerant is cooled within the thermoelectric subsystem first heat exchanger 142 and the first circuit refrigerant is heated within the thermoelectric subsystem first heat exchanger 142. As a result, the $T_1$ is greater than the $T_4$ and the second circuit refrigerant in the second circuit conduit system third conduit 138 has a seventh temperature $T_7$ that is less than the $T_6$.

The first thermoelectric cell 150 is controlled by the controller 166 to cause a transfer of heat from the first thermoelectric cell second side 154 to the first thermoelectric cell first side 152. In other words, the first thermoelectric cell second side 154 gets cooler while the first thermoelectric cell first side 152 gets warmer. Simultaneously, the first thermoelectric cell first side 152 transfers heat to the thermoelectric subsystem first heat exchanger 142 and therefore to the second circuit refrigerant within the thermoelectric subsystem first heat exchanger passage 144. In other words, the second circuit refrigerant is warmed by the first thermoelectric cell 150 and the first thermoelectric cell 150 is simultaneously cooled by the second circuit refrigerant.

The second thermoelectric cell 158 is controlled by the controller 166 to cause a transfer of heat from the second thermoelectric cell second side 162 to the second thermoelectric cell first side 160. In other words, the second thermoelectric cell second side 162 gets cooler while the second thermoelectric cell first side 160 gets warmer. Simultaneously, the second thermoelectric cell first side 160 transfers heat to the thermoelectric subsystem first heat exchanger 142 and therefore to the second circuit refrigerant within the thermoelectric subsystem first heat exchanger passage 144. In other words, the second circuit refrigerant is warmed by the second thermoelectric cell 158 and the second thermoelectric cell 158 is simultaneously cooled by the second circuit refrigerant.

The thermoelectric subsystem second heat exchanger 156 is cooled by the first thermoelectric cell 150 and the second thermoelectric cell 158. In other words, heat is transferred from the thermoelectric subsystem second heat exchanger 156 to the first thermoelectric cell 150 and the second thermoelectric cell 158. Additionally, the thermoelectric subsystem second heat exchanger 156 absorbs heat within the target 106, thereby cooling the target 106.

It is understood that the target 106 may additionally be cooled by the second refrigerant flowing within the second circuit conduit system third conduit 138, the thermoelectric subsystem first heat exchanger 142, and/or the second circuit conduit system fourth conduit 146. For example, if the controller 166 causes the first thermoelectric cell 150 and the second thermoelectric cell 158 to not operate (e.g., to be provided no voltage, to be provided no power, etc.), the target 106 may only be cooled by the second refrigerant flowing within the second circuit conduit system third conduit 138, the thermoelectric subsystem first heat exchanger 142, and the second circuit conduit system fourth conduit 146. Such cooling may be useful when the additional cooling provided by the first thermoelectric cell 150 and/or the second thermoelectric cell 158 is not required, such as when the target 106 is utilized for medium-temperature (MT) uses (e.g., refrigeration of meats, refrigeration of dairy products, etc.). In this way, the thermoelectric cooling system 100 may be more desirable because the thermoelectric cooling system 100 is capable of minimizing energy consumption.

In embodiments where the thermoelectric cooling system 100 includes the fan 164, the fan 164 operates to cause an airflow across the thermoelectric subsystem second heat exchanger 156. This airflow may increase a rate at which the thermoelectric subsystem second heat exchanger 156 is able to cool the target 106.

The second circuit refrigerant is heated within the thermoelectric subsystem first heat exchanger 142 to an eight temperature $T_8$. The $T_8$ is greater than the $T_7$. The $T_8$ may be different from, or the same as, the $T_5$.

The first circuit refrigerant is defined by a first freezing temperature $T_{1f}$ at which the first circuit refrigerant begins to freeze (e.g., solidify, gel, etc.). Similarly, the second circuit refrigerant is defined by a second freezing temperature $T_{2f}$ at which the second circuit refrigerant begins to freeze. The $T_{1f}$ is less than the $T_4$ (e.g., such that the first circuit refrigerant does not freeze within the first circuit 102, etc.). However, the $T_{1f}$ may be greater than the $T_6$. The $T_{2f}$ is less than the $T_7$ (e.g., such that the second circuit refrigerant does not freeze within the second circuit 104, etc.).

In some embodiments, the first circuit refrigerant and the second circuit refrigerant are the same. However, in other embodiments, the first circuit refrigerant and the second circuit refrigerant are different. In some applications, refrigerant with a higher freezing temperature may be less expensive than refrigerant with a lower freezing temperature. As such, the first circuit refrigerant and the second circuit refrigerant may be selected so as to minimize a cost of the thermoelectric cooling system 100. In some embodiments, the first circuit refrigerant and/or the second refrigerant is a hydro-fluorocarbon (HFC) refrigerant, a hydrofluoroolefin (HFO) refrigerant, or a natural refrigerant (e.g., a water-glycol refrigerant, etc.).

The thermoelectric cooling system 100 can be utilized in retrofit application where, prior to retrofitting with the thermoelectric cooling system 100, the target 106 is set up for MT uses but it is desired to additionally or alternatively utilize the target 106 for lower-temperature (LT) uses (e.g., frozen storage of frozen foods, etc.). To utilize the thermoelectric cooling system 100 in a retrofit application, the first thermoelectric cell 150 and the second thermoelectric cell 158 are coupled to an existing heat exchanger or conduit within the target 106, thereby forming the thermoelectric subsystem first heat exchanger 142. The thermoelectric subsystem second heat exchanger 156 is subsequently coupled to the first thermoelectric cell 150 and the second thermoelectric cell 158. In such a retrofit application, the first refrigerant and/or the second refrigerant may be selected for MT uses (e.g., the $T_{f1}$ is not low enough to be suitable for LT uses, the $T_{f2}$ is not low enough to be suitable for LT uses), but can enable the target 106 to be utilized for LT uses because of the heating provided to the second refrigerant by the first thermoelectric cell 150 and the second thermoelectric cell 158 and/or the heating provided by the second refrigerant to the first refrigerant. As such, the thermoelectric cooling system 100 may be utilized in retrofit applications without the use of new refrigerants. As a result, a cost of retrofitting using the thermoelectric cooling system 100 may be significantly less than the cost of retrofitting using other systems.

Advantageously, the first thermoelectric cell 150 and/or the second thermoelectric cell 158 can be controlled to provide a target amount of cooling to the target 106. For example, a voltage/power supplied to the first thermoelectric cell 150 and/or a voltage/power supplied to the second thermoelectric cell 158 can be controlled by the controller 166 such that the target 106 can attain a target temperature. In this way, the thermoelectric cooling system 100 can enable the target 106 to be used for LT uses (where the first thermoelectric cell 150 and the second thermoelectric cell 158 are provided higher voltages/powers) and MT uses (where the first thermoelectric cell 150 and the second thermoelectric cell 158 are provided lower voltages/powers).

In some embodiments, the thermoelectric subsystem second heat exchanger 156 is omitted and cooling is transferred from the first thermoelectric cell second side 154 and the second thermoelectric cell second side 162 directly.

Figure 2:
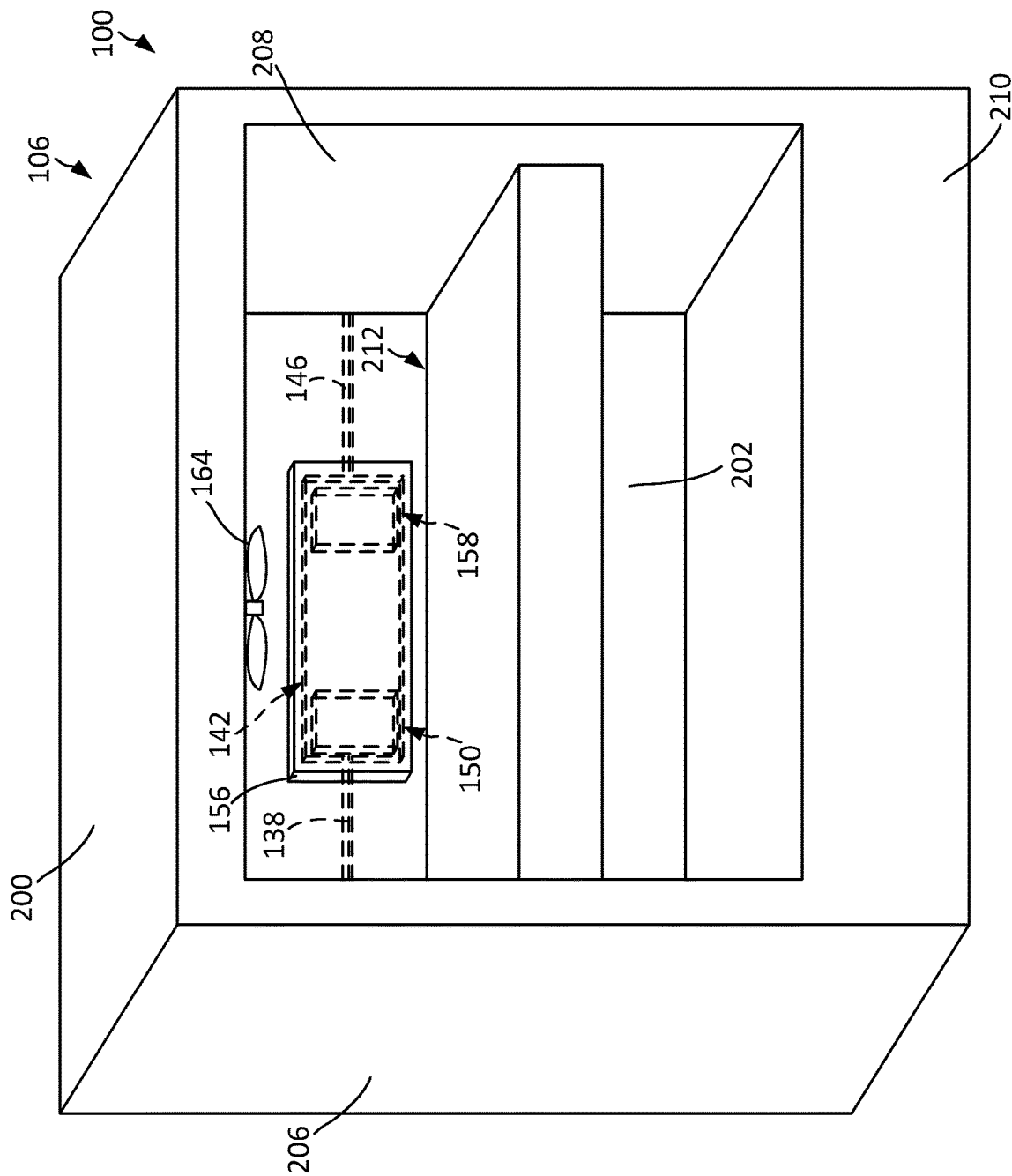
FIG. 2 is a perspective view of a thermoelectric cooling system installed in a target in a first configuration.

FIG. 2 illustrates the thermoelectric cooling system 100 installed in the target 106 in a first configuration. In an example embodiment, the target 106 includes a top wall 200, a rear wall 202 coupled to the top wall 200, a bottom wall 204 coupled to the rear wall 202, a first sidewall 206 coupled to the top wall 200, the rear wall 202, and the bottom wall 204, a second sidewall 208 coupled to the top wall 200, the rear wall 202, and the bottom wall 204, and a front wall 210 coupled to the top wall 200, the bottom wall 204, the first sidewall 206, and the second sidewall 208. Collectively, the top wall 200, the rear wall 202, the bottom wall 204, the first sidewall 206, the second sidewall 208, and the front wall 210 at least partially border a volume (e.g., refrigerated volume, etc.). The volume is configured to be cooled to a target temperature (e.g., 0 degrees Celsius, etc.) associated with the target 106, the target temperature being less than an ambient temperature (e.g., 20 degrees Celsius, etc.) of an environment (e.g., store, etc.) within which the target 106 is located.

The target 106 also includes a shelf 212 that is coupled to at least one of the top wall 200, the rear wall 202, the bottom wall 204, the first sidewall 206, the second sidewall 208, and the front wall 210 and extends within the volume of the target 106. The shelf 212 is configured to support a product (e.g., refrigerated product, frozen product, meat product, dairy product, frozen food, etc.) within the volume.

In the configuration shown in FIG. 2, the thermoelectric subsystem second heat exchanger 156 is coupled to the rear wall 202 and extends from the rear wall 202 into the volume. The first thermoelectric cell 150, the second thermoelectric cell 158, the thermoelectric subsystem first heat exchanger 142, the second circuit conduit system third conduit 138, and the second circuit conduit system fourth conduit 146 may extend within, behind, and/or in front of (e.g., relative to the front wall 210, etc.), the rear wall 202. Air that is proximate the thermoelectric subsystem second heat exchanger 156 is cooled and circulated within the volume to cool the target. It is understood that the thermoelectric subsystem second heat exchanger 156 may additionally or alternatively be coupled to any of the top wall 200, the bottom wall 204, the first sidewall 206, the second sidewall 208, the front wall 210, and the shelf 212.

The fan 164 is coupled to the top wall 200 and is configured to draw air upwards (e.g., towards the top wall 200, etc.), across the thermoelectric subsystem second heat exchanger 156 and to cause the air to circulate within the volume. In this way, the fan 164 may function to increase transfer of cooling from the thermoelectric subsystem second heat exchanger 156. It is understood that the fan 164 may additionally or alternatively be coupled to any of the rear wall 202, the bottom wall 204, the first sidewall 206, the second sidewall 208, the front wall 210, and the shelf 212.

Figure 3:
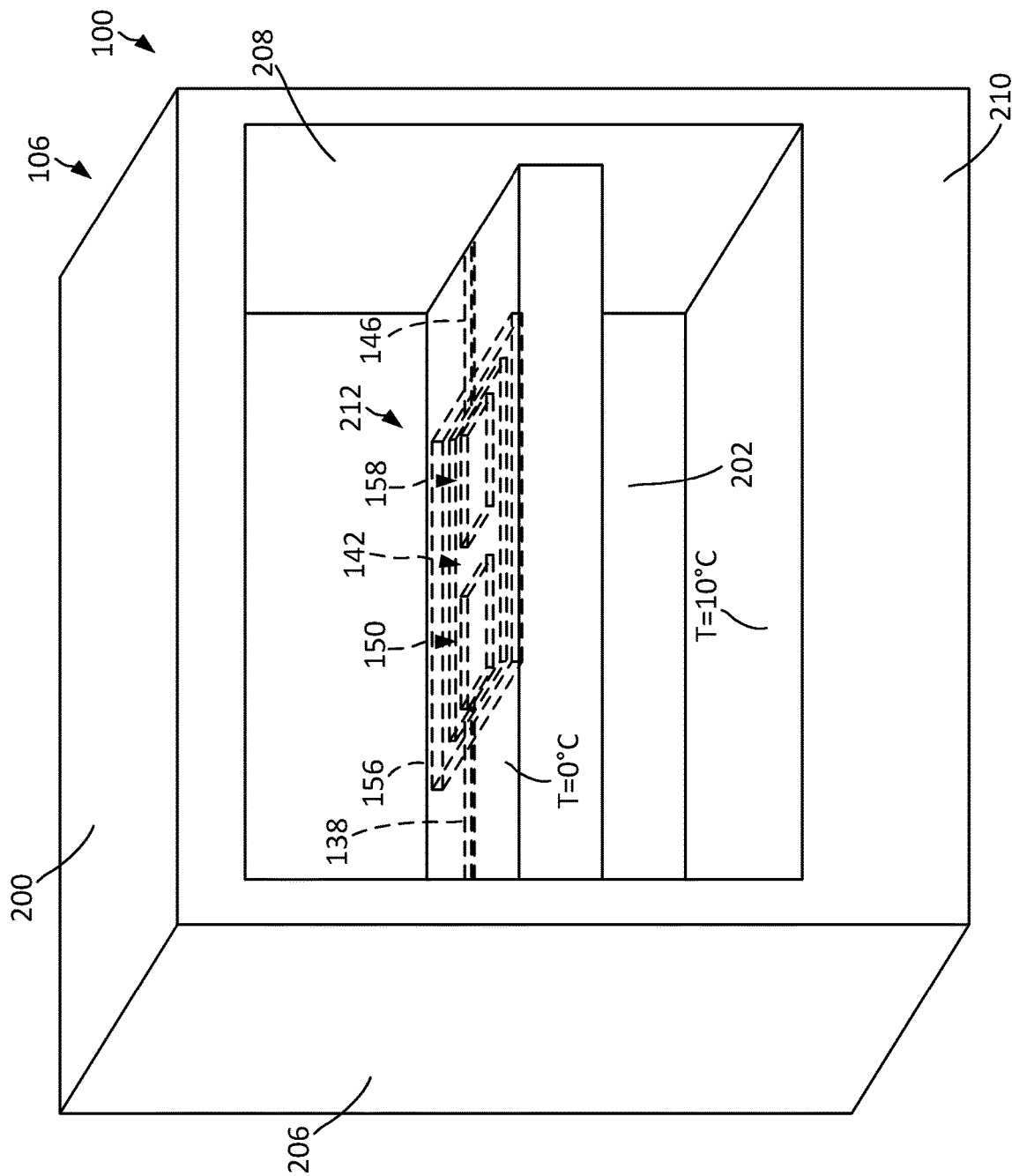
FIG. 3 is a perspective view of a thermoelectric cooling system installed in a target in a second configuration.
Figure 4:
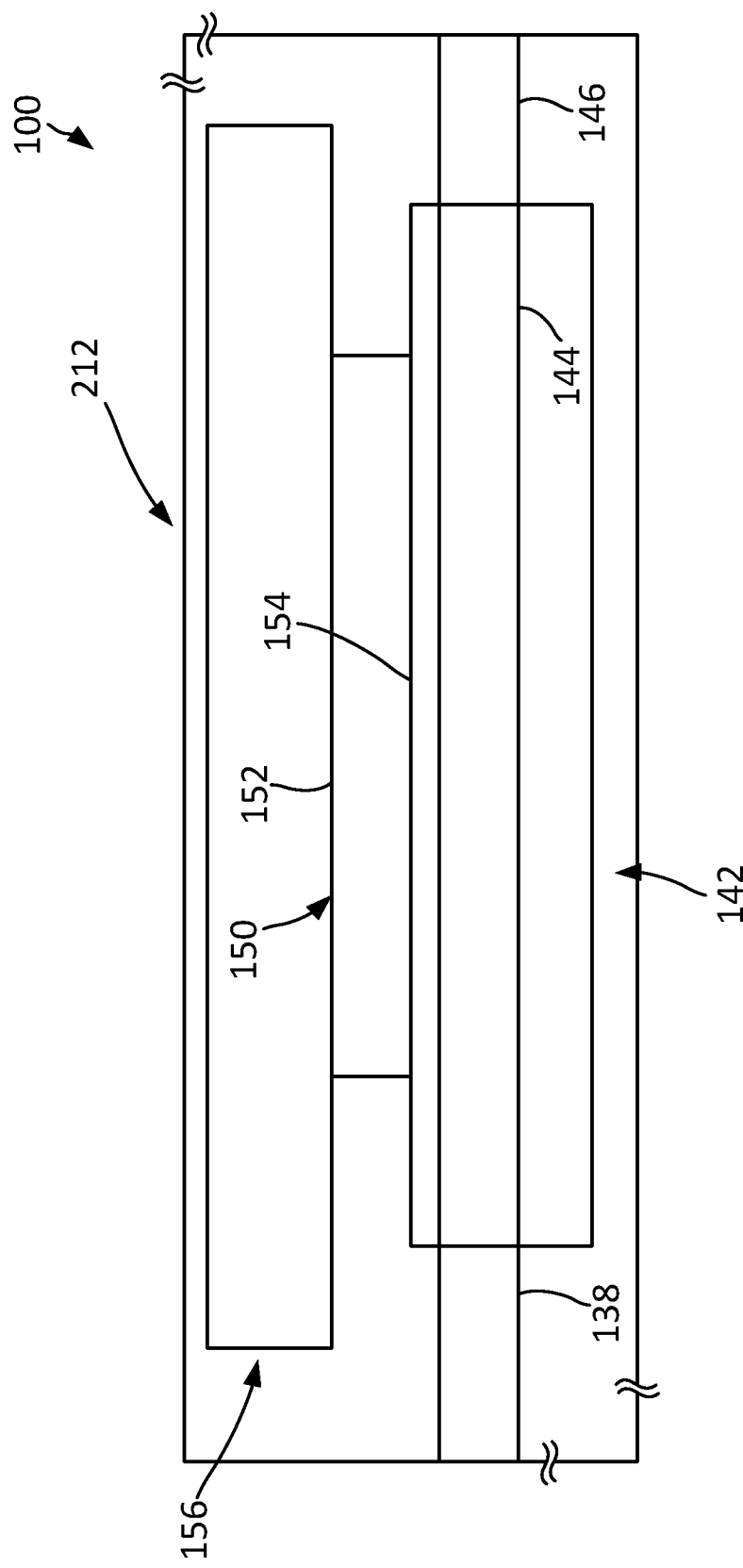
FIG. 4 is a cross-sectional view of a shelf of the target shown in FIG. 3.

FIGS. 3 and 4 illustrate the thermoelectric cooling system 100 installed in the target 106 in a second configuration. In this configuration, the thermoelectric subsystem second heat exchanger 156, the first thermoelectric cell 150, the second thermoelectric cell 158, the thermoelectric subsystem first heat exchanger 142, the second circuit conduit system third conduit 138, and the second circuit conduit system fourth conduit 146 are coupled to and extend within, behind, in front of, behind, and/or on top of, the shelf 212. As shown in FIGS. 3 and 4, the thermoelectric subsystem second heat exchanger 156, the first thermoelectric cell 150, the second thermoelectric cell 158, the thermoelectric subsystem first heat exchanger 142, the second circuit conduit system third conduit 138, and the second circuit conduit system fourth conduit 146 are contained within (e.g., embedded in, enclosed by, etc.) the shelf 212. In these embodiments, the thermoelectric subsystem second heat exchanger 156 may not include fins and may instead be configured to transfer cooling to the shelf 212 via conduction. In some embodiments, the thermoelectric cooling system 100 may not include the fan 164.

Advantageously, the thermoelectric subsystem second heat exchanger 156 may provide localized cooling on the shelf 212 (i.e., where products are located) thereby cooling the products without unnecessarily cooling the volume. As a result, energy consumption of the thermoelectric cooling system 100 may be minimized. Additionally, the localized cooling provided by the thermoelectric subsystem second heat exchanger 156 may enable a portion of the volume to be utilized for MT uses while the shelf 212 is utilized for LT uses, thereby enabling the target 106 to be utilized for both MT uses and LT uses simultaneously. As shown in FIG. 3, the shelf 212 may attain a temperature of 0 degrees Celsius, which may be suitable for LT uses, and another portion of the target 106 (e.g., another shelf, etc.) may attain a temperature of 10 degrees Celsius, which may be suitable for MT uses.

In some embodiments, the first circuit compressor 110 is a pump similar to the second circuit pump 132. For example, the first circuit 102 may be connected to an external loop (e.g., a glycol loop, etc.) and a pump (e.g., similar to the second circuit pump 132, etc.) of the external loop may be utilized to circulate the first circuit refrigerant through the first circuit 102.

In some embodiments, the thermoelectric cooling system 100 does not include the first circuit 102. Instead, the thermoelectric cooling system 100 includes only the second circuit 104 and the thermoelectric subsystem 140.

III. Construction of Example Embodiments

While this specification contains many specific implementation details, these should not be construed as limitations on the scope of what may be claimed but rather as descriptions of features specific to particular implementations. Certain features described in this specification in the context of separate implementations can also be implemented in combination in a single implementation. Conversely, various features described in the context of a single implementation can also be implemented in multiple implementations separately or in any suitable subcombination. Moreover, although features may be described as acting in certain combinations and even initially claimed as such, one or more features from a claimed combination can, in some cases, be excised from the combination, and the claimed combination may be directed to a subcombination or variation of a subcombination.

As utilized herein, the term "generally" and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

The term "coupled" and the like, as used herein, mean the joining of two components directly or indirectly to one another. Such joining may be stationary (e.g., permanent) or moveable (e.g., removable or releasable). Such joining may be achieved with the two components or the two components and any additional intermediate components being integrally formed as a single unitary body with one another, with the two components, or with the two components and any additional intermediate components being attached to one another.

The terms "fluid communication with" and the like, as used herein, mean the two components or objects have a pathway formed between the two components or objects in which a fluid, such as air, liquid refrigerant, gaseous refrigerant, mixed-phase refrigerant, etc., may flow, either with or without intervening components or objects. Examples of configurations for enabling fluid communication may include piping, channels, or any other suitable components for enabling the flow of a fluid from one component or object to another.

It is important to note that the construction and arrangement of the system shown in the various example implementations is illustrative only and not restrictive in character. All changes and modifications that come within the spirit and/or scope of the described implementations are desired to be protected. It should be understood that some features may not be necessary, and implementations lacking the various features may be contemplated as within the scope of the application, the scope being defined by the claims that follow. When the language "a portion" is used, the item can include a portion and/or the entire item unless specifically stated to the contrary.

Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, Z, X and Y, X and Z, Y and Z, or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

Additionally, the use of ranges of values (e.g., W to P, etc.) herein are inclusive of their maximum values and minimum values (e.g., W to P includes W and includes P, etc.), unless otherwise indicated. Furthermore, a range of values (e.g., W to P, etc.) does not necessarily require the inclusion of intermediate values within the range of values (e.g., W to P can include only W and P, etc.), unless otherwise indicated.

What is claimed is:

1. A thermoelectric cooling system comprising:
 a first circuit configured to circulate a first refrigerant, the first circuit comprising:
  a first circuit conduit system first conduit coupled to a circuit heat exchanger first passage and configured to receive the first refrigerant from the circuit heat exchanger first passage;
  a first circuit compressor coupled to the first circuit conduit system first conduit and configured to receive the first refrigerant from the first circuit conduit system first conduit;
  a first circuit conduit system second conduit coupled to the first circuit compressor and configured to receive the first refrigerant from the first circuit compressor;

a first circuit condenser coupled to the first circuit conduit system second conduit and configured to receive the first refrigerant from the first circuit conduit system second conduit;

a first circuit conduit system third conduit coupled to the first circuit condenser and configured to receive the first refrigerant from the first circuit condenser;

a first circuit expansion device coupled to the first circuit conduit system third conduit and configured to receive the first refrigerant from the first circuit conduit system third conduit; and a first circuit conduit system fourth conduit coupled to the first circuit expansion device and the circuit heat exchanger first passage and configured to receive the first refrigerant from the first circuit expansion device and provide the first refrigerant to the circuit heat exchanger first passage;

a second circuit configured to circulate a second refrigerant;

a circuit heat exchanger comprising:
the circuit heat exchanger first passage coupled to the first circuit and configured to receive the first refrigerant from the first circuit and provide the first refrigerant to the first circuit; and
a circuit heat exchanger second passage coupled to the second circuit and configured to receive the second refrigerant from the second circuit and provide the second refrigerant to the second circuit;

a thermoelectric sub system comprising:
a thermoelectric subsystem first heat exchanger having a thermoelectric subsystem first heat exchanger passage coupled to the second circuit and configured to receive the second refrigerant from the second circuit and provide the second refrigerant to the second circuit; and
a first thermoelectric cell coupled to the thermoelectric subsystem first heat exchanger; and a controller operatively coupled to the first circuit, the second circuit, and the thermoelectric subsystem, the controller configured to:
control at least one operating parameter supplied to at least one of the first circuit, the second circuit, or the thermoelectric subsystem, the at least one operating parameter comprising a first voltage and a second voltage, controlling the at least one operating parameter supplied to the first circuit and the second circuit comprises:
selecting the first voltage so as to cause the first thermoelectric cell to provide a target rate of cooling;
supplying the first voltage to the first thermoelectric cell;
selecting the second voltage so as to cause the first thermoelectric cell to provide the target rate of cooling; and
supply the second voltage to the first circuit compressor; and
based on the at least one operating parameter, cause the first thermoelectric cell to provide the target rate of cooling.

2. The thermoelectric cooling system of claim 1, wherein:
the first thermoelectric cell comprises:
a first thermoelectric cell first side; and
a first thermoelectric cell second side;
the first thermoelectric cell is coupled to the thermoelectric subsystem first heat exchanger via the first thermoelectric cell first side;
the thermoelectric subsystem further comprises a thermoelectric subsystem second heat exchanger;
the first thermoelectric cell is coupled to the thermoelectric subsystem second heat exchanger via the first thermoelectric cell second side; and
the first thermoelectric cell separates the thermoelectric subsystem first heat exchanger from the thermoelectric subsystem second heat exchanger.

3. The thermoelectric cooling system of claim 2, further comprising a fan oriented towards the thermoelectric subsystem second heat exchanger and configured to cause air to flow across the thermoelectric subsystem second heat exchanger.

4. The thermoelectric cooling system of claim 2, wherein the thermoelectric subsystem further comprises a second thermoelectric cell coupled to the thermoelectric subsystem first heat exchanger and the thermoelectric subsystem second heat exchanger.

5. The thermoelectric cooling system of claim 4, wherein:
the second thermoelectric cell comprises:
a second thermoelectric cell first side; and
a second thermoelectric cell second side;
the second thermoelectric cell is coupled to the thermoelectric subsystem first heat exchanger via the second thermoelectric cell first side;
the second thermoelectric cell is coupled to the thermoelectric subsystem second heat exchanger via the second thermoelectric cell second side; and
the second thermoelectric cell separates the thermoelectric subsystem first heat exchanger from the thermoelectric subsystem second heat exchanger.

6. The thermoelectric cooling system of claim 1, wherein:
the second circuit comprises:
a second circuit conduit system first conduit;
a second circuit pump coupled to the second circuit conduit system first conduit and configured to receive the second refrigerant from the second circuit conduit system first conduit;
a second circuit conduit system second conduit coupled to the second circuit pump and the circuit heat exchanger second passage and configured to receive the second refrigerant from the second circuit pump and to provide the second refrigerant to the circuit heat exchanger second passage;
a second circuit conduit system third conduit coupled to the circuit heat exchanger second passage and the thermoelectric subsystem first heat exchanger passage and configured to receive the second refrigerant from the circuit heat exchanger second passage and to provide the second refrigerant to the thermoelectric subsystem first heat exchanger passage;
a second circuit conduit system fourth conduit coupled to the thermoelectric subsystem first heat exchanger passage and configured to receive the second refrigerant from the thermoelectric subsystem first heat exchanger passage; and
a reservoir coupled to the second circuit conduit system fourth conduit and the second circuit conduit system first conduit and configured to receive the second refrigerant from the second circuit conduit system fourth conduit and to provide the second refrigerant to the second circuit conduit system first conduit.

7. The thermoelectric cooling system of claim 6, wherein the controller is further configured to operate the first circuit compressor, the first circuit expansion device, and the second circuit pump such that a temperature of the first refrigerant in the first circuit conduit system fourth conduit is less than a temperature of the second refrigerant in the second circuit conduit system second conduit.

8. The thermoelectric cooling system of claim 1, wherein the second refrigerant is the same as the first refrigerant.

9. The thermoelectric cooling system of claim 1, wherein:
the first refrigerant is defined by a first freezing temperature;
the second refrigerant is defined by a second freezing temperature; and
the second freezing temperature is lower than the first freezing temperature.

10. The thermoelectric cooling system of claim 4, further comprising a temperature controlled enclosure that comprises:
a rear wall;
a first sidewall coupled to the rear wall;
a second sidewall coupled to the rear wall;
a front wall coupled to the first sidewall and the second sidewall; and
a shelf coupled to at least one of the rear wall, the first sidewall, the second sidewall, or the front wall, the first thermoelectric cell coupled to the shelf.

11. The thermoelectric cooling system of claim 10, wherein the thermoelectric subsystem first heat exchanger, the second thermoelectric cell, and the thermoelectric subsystem second heat exchanger are coupled to the shelf.

12. The thermoelectric cooling system of claim 10, wherein the temperature controlled enclosure is one of: a display case, a freezer case, a temperature controlled case, a refrigerator, a freezer, a locker, a temperature controlled device, or a walk-in cooler.

13. The thermoelectric cooling system of claim 10, wherein each of the thermoelectric subsystem first heat exchanger, the first thermoelectric cell, the thermoelectric subsystem second heat exchanger, and the second thermoelectric cell is within, behind, in front of, or on top of the shelf.

14. The thermoelectric cooling system of claim 4, wherein the thermoelectric subsystem first heat exchanger extends across one of the first thermoelectric cell or the second thermoelectric cell, and then across the other of the first thermoelectric cell or the second thermoelectric cell.

15. The thermoelectric cooling system of claim 4, wherein the first thermoelectric cell and the second thermoelectric cell are arranged in series.

16. The thermoelectric cooling system of claim 4, wherein the first thermoelectric cell and the second thermoelectric cell are arranged in parallel.

17. The thermoelectric cooling system of claim 4, wherein the thermoelectric subsystem first heat exchanger extends across at least a portion of the first thermoelectric cell and at least a portion of the second thermoelectric cell simultaneously.

18. The thermoelectric cooling system of claim 2, further comprising a plurality of fins extending from the thermoelectric subsystem second heat exchanger.

19. The thermoelectric cooling system of claim 2, further comprising at least one fan oriented towards the thermoelectric subsystem second heat exchanger and configured to cause air to flow across the thermoelectric subsystem second heat exchanger.

20. The thermoelectric cooling system of claim 1, wherein the first refrigerant is different than the second refrigerant.

21. The thermoelectric cooling system of claim 9, wherein the first refrigerant and the second refrigerant are the same.

22. The thermoelectric cooling system of claim 1, wherein each of the first refrigerant and the second refrigerant is a hydro-fluorocarbon refrigerant, a hydro-fluoroolefin refrigerant, or a natural water-glycol refrigerant.

23. The thermoelectric cooling system of claim 10, wherein the thermoelectric subsystem second heat exchanger is coupled to and positioned relative to the shelf to transfer cooling to the shelf via conduction.

24. The thermoelectric cooling system of claim 1, wherein the at least one operating parameter comprises a valve position, and the controller is configured to:
select the valve position so as to cause the first thermoelectric cell to provide the target rate of cooling; and
cause the first circuit expansion device to attain the valve position associated with a flow rate of the first refrigerant through the first circuit expansion device.

* * * * *